United States Patent [19]
Daberko

[11] Patent Number: 5,787,445
[45] Date of Patent: Jul. 28, 1998

[54] OPERATING SYSTEM INCLUDING IMPROVED FILE MANAGEMENT FOR USE IN DEVICES UTILIZING FLASH MEMORY AS MAIN MEMORY

[75] Inventor: Norbert Daberko, Oceanside, Calif.

[73] Assignee: Norris Communications Corporation, Poway, Calif.

[21] Appl. No.: 612,772

[22] Filed: Mar. 7, 1996

[51] Int. Cl.$^6$ .................................... G06F 17/30

[52] U.S. Cl. ............... 707/205; 707/102; 711/200; 711/209; 711/2; 711/5

[58] Field of Search ................ 395/613, 621, 395/459, 518, 319; 707/102, 205

[56] References Cited

U.S. PATENT DOCUMENTS

| | | | |
|---|---|---|---|
| 4,685,057 | 8/1987 | Lemone et al. | 364/200 |
| 5,200,959 | 4/1993 | Gross et al. | 371/21.6 |
| 5,263,160 | 11/1993 | Porter et al. | 395/600 |
| 5,337,275 | 8/1994 | Garner | 365/189.01 |
| 5,341,330 | 8/1994 | Wells et al. | 365/185 |
| 5,357,475 | 10/1994 | Hasbun et al. | 365/218 |
| 5,404,485 | 4/1995 | Ban | 395/425 |
| 5,437,020 | 7/1995 | Wells et al. | 395/425 |
| 5,448,577 | 9/1995 | Wells et al. | 371/40.1 |
| 5,454,103 | 9/1995 | Coverston et al. | 395/600 |
| 5,551,020 | 8/1996 | Flax et al. | 395/600 |
| 5,581,736 | 12/1996 | Smith | 395/497.01 |
| 5,586,291 | 12/1996 | Lasker et al. | 395/440 |
| 5,602,987 | 2/1997 | Harari et al. | 395/182.06 |

OTHER PUBLICATIONS

William Pugh, "Skip List: A Probabilistic alternative to balance trees", communication of the ACM vol. 33, No. 6, pp. 668–676, Jun. 1990.

Robert Sedgewick "Algorithms", Addison –Wesley publishing Co. pp. 15–33, 1988.

Jeffrey et al. "Data structures", Prentice–Hall, Inc. pp. 54–65, 184–191, 1989.

Alfred et al. "Data structure and algorithms" Addison–Wesley Publishing Co., pp. 53–69, 1983).

Primary Examiner—Thomas G. Black
Assistant Examiner—Jean M. Corrielus
Attorney, Agent, or Firm—Thorpe, North & Western, LLP

[57] ABSTRACT

A method of memory management for a primary memory created from a non-volatile, long-term storage medium, in particular flash memory, which enables direct manipulation of data segments stored therein. The data segments of a single file are typically not stored contiguously in relation to the order in which they are stored and subsequently recalled, yet the method enables recall in the logical order in which the data segments were created. This method is particularly useful for flash memory which has the characteristic of not being able to overwrite data in memory without first erasing previously recorded data. The method comprises the minimum steps of dividing the primary memory into equal size blocks, each block being the smallest amount of data which can be read from or written to memory in a single read or write operation. A cache memory the size of at least one of the read/write blocks is then coupled to the primary memory and provides temporary storage space for data being written to and read from primary memory.

25 Claims, 10 Drawing Sheets

LIFO STACK

OPERATING SYSTEM INCLUDING IMPROVED FILE MANAGEMENT FOR USE IN DEVICES UTILIZING FLASH MEMORY AS MAIN MEMORY

BACKGROUND OF THE INVENTION

1. Field of the Invention

This invention pertains to a system for memory management in a non-volatile, long-term storage medium. More particularly, this system organizes flash memory such that data storage and retrieval is optimized so as to decrease system overhead and thereby increase data throughput, system stability and fault tolerance.

2. Prior Art

Efficient organization of data stored in long-term storage media is becoming increasingly important because of the substantial benefits which they provide over short-term counterparts. That is to say, long-term storage media typically provide the benefit of substantially non-volatile retention of data. Reliable data retrieval is becoming increasingly crucial in our information society because information management is now an indispensable tool of successful business. However, implementation of a system which can provide reliable data retrieval typically comes at a price of reduced performance and convenience. For example, long-term data storage media are usually slower, more difficult to work with, consume more energy, and are relatively bulky in comparison to short-term storage media.

Typical long-term storage media include but are not limited to flash memory, hard disks, floppy disks, tape and CD-ROMs. The main distinguishing feature of this media is that withdrawal of applied power does not result in a loss of the data stored therein. In contrast, short-term storage media include random access memory (RAM) which loses memory upon removal of applied power.

Despite the drawback of losing data stored in RAM when power is withdrawn, the benefits of RAM are substantial and not dismissed without consequences. For example, RAM is faster, has no moving parts, and RAM does not need to erase data stored at a particular address within RAM before new data can be written to that same address. Nevertheless, the challenge of providing virtually uninterruptable power to RAM also comes with a hardware penalty of redundant power systems. Furthermore, RAM is difficult and expensive to use, and not always possible because of size and power considerations.

A quick comparison of the benefits listed above for RAM versus the benefits of long-term storage media shows that a user had to be satisfied with a data storage system such as a hard disk, floppy disk, tape backup or CD-ROM that is not as fast as RAM, draws significantly greater amounts of power, is bulkier and thus less convenient, but is relatively much more reliable. Most of the drawbacks can be blamed on all the media requiring moving mechanical components. In contrast, RAM is very convenient, fast and draws substantially less power, yet cannot be relied upon not to lose data without the considerable expense and bulk of redundant power systems.

The long-term storage medium which conspicuously differs from those mentioned is flash memory. Using the same criteria for comparison as above, data can be read from flash memory at a speed closer to RAM, draws power at a rate far below that of RAM, and the media has no mechanical component to power, but flash memory must first erase data from a particular address before new data may be written to the same physical address. Flash memory is also of a comparable size to RAM because they are both manufactured on computer chips as integrated circuits (IC).

Therefore, it would be advantageous to be able to replace RAM with a long-term storage medium when the substantial benefits of non-volatile data retention are required. When examining the characteristics of the long-term storage media above, it is apparent that the storage medium most similar to RAM because of size, power requirements, and speed is flash memory. Yet there remains the issue of flash memory requiring erasure of data before the memory space occupied by that data is reusable. Therefore, it would be advantageous to have a method of managing flash memory which would compensate for the erasure requirement. It would be a further advantage if this method minimized system overhead while increasing throughput of data storage and retrieval. It would also be an advantage if this same method could be applied to the other long-term storage media.

Before discussing the present invention, it is helpful to look at existing methods of memory management which are commonly referred to as operating system file structures. The Microsoft DOS operating system, hereinafter referred to as DOS, allocates long-term memory space through the use of a file allocation table (FAT) associated with the particular memory. When a hard disk drive is first used, it is divided into sectors each of a fixed size and residing at a fixed place on the drive media. Each sector is then given a number. The FAT is a method for the DOS operating system to determine which sectors on a disk are used for a file. The FAT is essentially a map showing the location of files in the sectors by providing to the operating system the information needed to access data, such as the sector number of a file and possibly the length of the data in that file. The DOS system then typically saves the FAT on the disk at a dedicated location where data is not permitted to overwrite it. Thus the allocation of sectors in the FAT is the manner by which the operating system determines how much memory space is available.

A prior art method of file management designed specifically for flash memory is explained in U.S. Pat. No. 5,404,485 issued to Ban. Ban, however, still takes the more conventional and disadvantageous approach of manipulating data stored in flash memory by first reading the data out to a large RAM, manipulating the data in RAM, erasing the flash memory where the data was originally stored, and then writing the data from RAM back to a contiguous block of flash memory. Ban also disadvantageously creates a file structure similar to DOS which maps the location of stored data.

The method of Ban creates several severe overhead burdens on the system which substantially hurt system performance. More specifically, Ban uses a virtual memory mapping system similar to the DOS FAT, the virtual memory map converting virtual addresses to physical addresses. Using this method of indirection, Ban attempts to facilitate use of flash memory as RAM. The problem with this approach is that Ban creates the need for this indirection because data manipulation takes place outside of flash memory. Ban mistakenly teaches that the time wasted copying blocks of data from flash memory to RAM for manipulation then back into flash memory is unavoidable.

A further significant drawback to Ban is the lack of fault tolerance in a system that utilizes a virtual map stored partially in RAM. The system is inherently unstable because any loss of power to RAM destroys the map which must then be reconstructed before the system can read or write data to flash memory.

Another drawback of Ban is that the RAM requirement grows as flash memory grows. This is the consequence of using a virtual map whose size is dependent upon the total amount of RAM available, and is thus a ratio of the larger flash memory media in order to reflect a scaled version of what is stored in physical addresses.

Ban essentially teaches that it is necessary to follow the method already used in the conventional DOS operating system which also relies on long-term storage in conjunction with significant RAM resources. That is to say, the access to and structure of storage media is changed as little as possible so that the operating system does not have to be significantly altered to utilize flash memory.

While the objective of making a system see flash memory as RAM with its accompanying benefits of non-volatility is desirable, the approach taken by Ban fails to take full advantage of flash memory by continuing to rely heavily on RAM resources. This system then suffers from lack of fault tolerance which not only jeopardizes reliability, but slows down the entire system by requiring large data transfers between RAM and flash memory.

Accordingly, the challenge is to use a non-volatile, long-term storage medium such as flash memory which can take advantage of increased fault tolerance to power interruption, significantly reduced RAM resources, and reduced system overhead caused by data transfers between RAM and the storage medium, while overcoming the erasure drawbacks unique to flash memory.

OBJECTS AND SUMMARY OF THE INVENTION

It is an object of the present invention to provide a file system for non-volatile, long-term storage media which has a low processing overhead requirement, thus increasing data throughput.

It is another object of this invention to provide a file system which has particular application to the storage medium of flash memory.

It is yet another object of the present invention to provide a file system which is significantly fault tolerant, only losing data stored in a relatively small cache memory if power to the system is interrupted.

It is a further object of the invention to provide a file system which does not require significant random access memory (RAM) resources.

It is yet another object to provide a file system which further reduces RAM requirements by replacing a memory map with logically linked serial data segments.

Another object is to provide a file system which efficiently and transparently erases flash memory in the background to further improve system performance.

Yet another object is to reduce cost, space and power consumption by eliminating battery backup of information stored in a non-volatile primary memory.

Still another object is to provide a file system which uses absolute physical memory addresses to avoid the additional overhead created by memory mapping.

These and other objects are realized in a method of memory management for a primary memory created from non-volatile, long-term storage media, in particular flash memory, which enables direct manipulation of data segments stored therein. Furthermore, the present invention comprises two methods of data storage and subsequent retrieval. Common to both methods is the reality that the order in which data segments are subsequently recalled is typically not the order in which the data segments were saved to memory. Unique to each method, however, is the order in which data segments are logically linked to each other. The first and simpler method enables sequential recall of data in the order in which it was saved in memory. This sequential recall is referred to as logical recall because it refers to a sequence in time in which data was saved, and not the physical order which the data occupies in memory. This method is particularly useful for flash memory which has the characteristic of not being able to overwrite data in memory without first erasing previously recorded data.

The second and more complex method allows for more sophisticated linking files. Instead of strictly linking files based on the order in which they are received, files are logically linked based on subject matter. Specifically, files are logically grouped together within directories and subdirectories. Yet because all files can be traced back in origin to a single root directory, all files are still logically linked to each other. Both methods comprise the minimum steps of logically dividing the primary memory into equal size blocks, each block being the smallest amount of data which can be read from or written to memory in a single read or write operation. A cache memory the size of at least one of the read/write blocks is then coupled to the primary memory and provides temporary storage space for data being written to and read from primary memory.

In a write operation of a new data segment, a header is placed at the beginning of the segment. The header indicates which logically related data segment precedes the new data segment. The header also indicates the location of the next logically related and subsequent data segment. By defining a "current data segment" as being the physical address of the data segment (and header) where an operation such as reading or writing would occur, previous or subsequent data segments can be accessed by moving from data segment to data segment by reading the appropriate header entry for a previous or subsequent data segment. The header entry contains an absolute physical address in primary memory of the target data segment.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention.

Before discussing the details of implementation of the file system and the resulting benefits, it is beneficial to be reminded of the basic principles of flash memory as they apply to the present invention. First, as has already been stated, flash memory requires that previously written data be erased before the occupied space is used to save new data. If data is not erased, the new data is either corrupted or not written at all. Second, flash memory is of course non-volatile. This means that no backup power source is required to retain the data once it has been written to memory.

Figure 1:
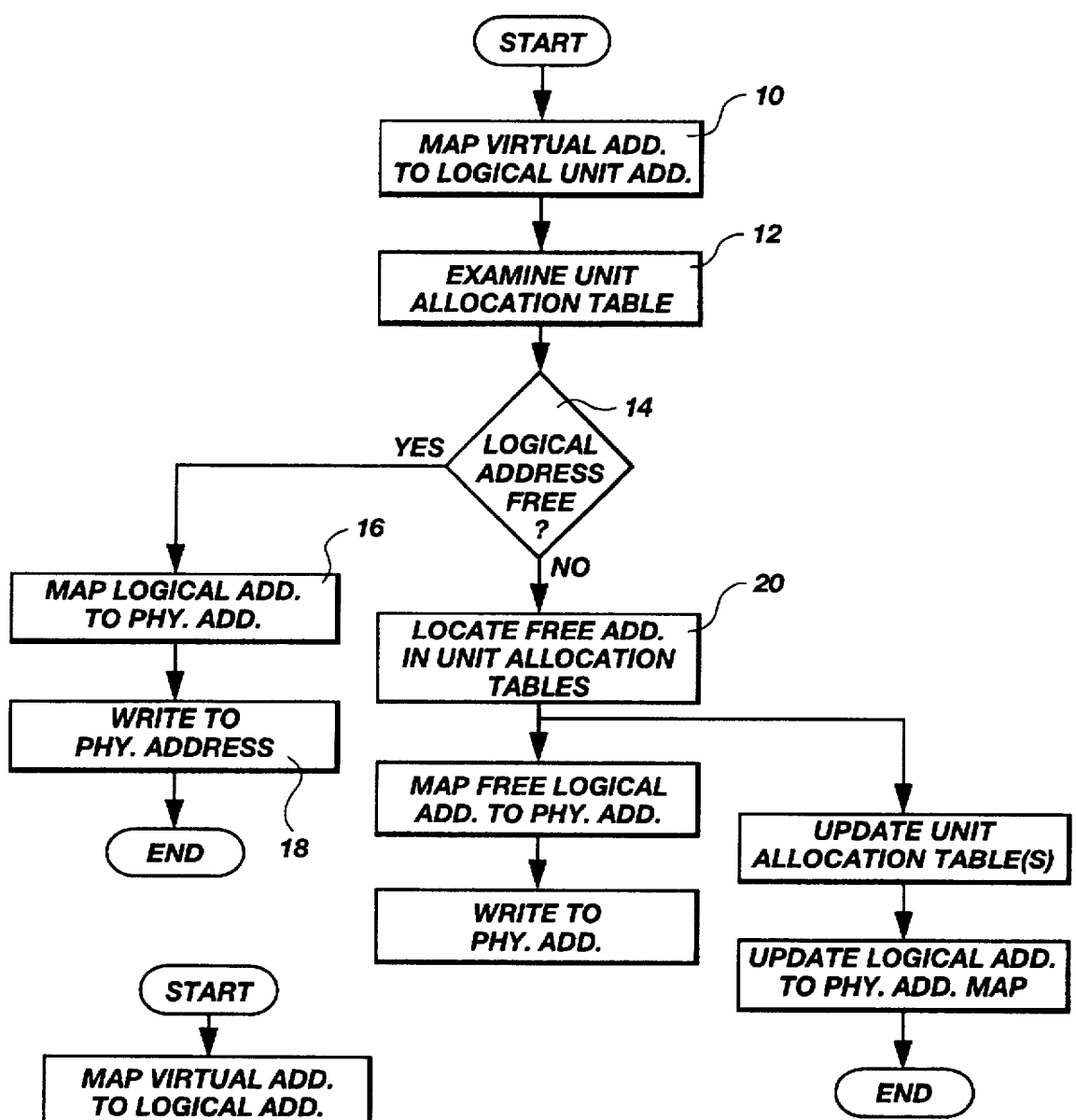
FIG. 1 is a flowchart of the steps of Ban for writing data to primary memory with the use of a virtual memory map.

The previously mentioned Ban patent, U.S. Pat. No. 5,404,485, describes a virtual memory mapping method of memory management developed specifically for flash memory. The basic teaching of the patent is apparently an attempt to make flash memory appear as RAM. The problem, as stated previously, is that flash memory must erase previously saved data before new data can be written to the same memory space. Ban recognizes the inherent difficulty of using flash memory because of this limitation, and approaches the problem as illustrated in FIG. 1.

Ban is typical of previous methods of imitating RAM because Ban teaches that manipulation of data cannot be done in flash memory directly. Instead, data is always erased from flash memory, manipulated in RAM, and resaved to physically create a segment of manipulated data that appears in its complete and contiguous form. For example, step 10 looks for a contiguous block of memory large enough to store the entire manipulated file.

The present invention, however, realizes that data does not have to be contiguous in order to be readable in a logical or relational order. The present invention claims being able to manipulate data directly in flash memory because the flash file system of the present invention enables data to be read in a logical order regardless of how many segments the file is comprised of, and where these segments are saved in memory. That is to say, implementation of the flash file system requires that each data segment have written to it a header. Within the header in predetermined fields, absolute physical addresses are saved. These addresses are physical locations within flash memory of the next logical data segment. Thus, regardless of an actual physical location, data segments are retrievable in a seemingly contiguous order despite the fact that typically the data segments are not stored contiguously.

Therefore, a key distinction between Ban and the present invention is that Ban continues to actually make all logically related data segments physically contiguous, while this invention advantageously only makes related data segments logically contiguous by creating headers which contain pointers to absolute physical locations within flash memory which provide a logical path to the data segments. Stated more explicitly then, one of the advantages of the method of the present invention is that overhead (an unproductive operation of a flash memory file system) is significantly reduced. For example, Ban requires that all related data segments (an entire file which could be several megabytes long) be read from flash memory to RAM, the modification to the data segments be made in RAM (even the insertion or deletion of a single data bit), and then the data segments transferred back to flash memory only if a completely contiguous flash memory location exists. If no such contiguous location is available, flash memory would then be erased. If this process produces contiguous flash memory space which is insufficiently large, then other data segments adjacent to the desired memory space would also have to be read to RAM, erased from flash memory, and transferred back to flash memory at a new location so as to create a sufficiently large contiguous memory space for the originally manipulated file.

The process of Ban described above reveals the tremendous overhead which its file system not only can produce, but is likely to produce. Overhead is likely because fragmentation of memory is typical of storage media. Flash memory is particularly vulnerable because of the requirement that new data cannot be written directly over old data as in most other storage media.

The present invention thus overcomes the significant overhead problem of Ban by completely eliminating the transfer of any data segment which is to be modified. All modifications take place as changes to data segment headers only. Therefore, modifications are done directly in flash memory, and this process will now be explained more fully.

FIG. 1 shows in a relatively simplified flowchart the process for writing data to flash memory by Ban. A quick walk-through will highlight the important features. The method involves a two-step translation process. First, a virtual address is mapped to a logical unit address in step 10. Secondly, a logical address is examined to verify if it is unallocated in steps 12 and 14. If the logical address is free, the logical address is mapped to a physical address in step 16, and then the data is written to the physical address in step 18. If the logical address was allocated, logical addresses are examined to find free memory in step 20, and then the appropriate mapping and writing is accomplished as above.

In Ban, the method uses the concept of dereferencing to allow frequent movement of data. Dereferencing of data is a common programming technique that is partly used because it allows frequently updated blocks of data to be moved within RAM without losing track of the data. Losing track of mapped data is the dreaded "dangling pointer" problem associated with dereferenced data. A dangling pointer occurs when a pointer providing the memory location of data is not updated with a new address of the data after it is moved.

In Ban's method, movement is required because all modifications to data must take place in RAM, then saved back into flash memory. The implication of this process is obvious; overhead is tremendously taxing of processor resources as it becomes dedicated to the steps of FIG. 1. For example, even the slightest change to data requires reading all related data from flash memory to RAM, erasing the data from flash memory, modifying the data in RAM, and then saving all of the data back to flash memory in contiguous memory space. If all remaining contiguous data blocks are not sufficiently large for the data in RAM, memory must be rearranged to create a contiguous memory space.

Figure 2:
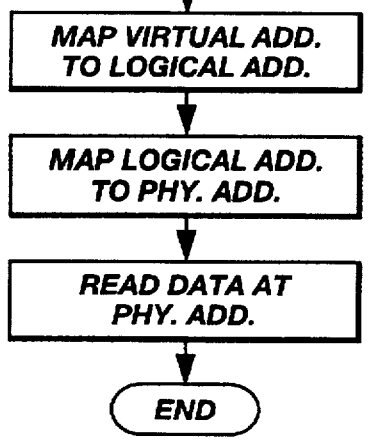
FIG. 2 is a flowchart of the steps of Ban for reading data from primary memory to a RAM resource.

FIG. 2 illustrates Ban's relatively simpler steps involved in reading data from flash memory, as opposed to the steps of writing described in FIG. 1. The key feature to recognize is that Ban's method requires indirection through virtual mapping to compensate for the frequent movements of data. The technique apparently enables flash memory to imitate the look of RAM, but at the crippling overhead cost of significant data movement when any modification is made.

A last significant feature of Ban which must be illustrated applies both to the method of Ban and the required hardware for implementation of the method. Specifically, Ban requires a relatively large amount of RAM. This large RAM requirement is necessitated by the complication that the largest block of data which is modifiable must be able to fit entirely in RAM for modification. Providing a RAM resource for the worst case scenario is costly to provide and to supply with power. Also stored in RAM is the virtual map. Ban apparently attempts to limit reliance on RAM and increase fault tolerance by forcing a portion of the virtual map into flash memory. By splitting the virtual map, Ban also succeeds in increasing overhead again by creating a non-trivial process for locating the physical address of data as illustrated in FIG. 1. The attempt at increased fault tolerance is also only partially successful.

For example, and this point must be emphasized, any modified data in RAM is permanently lost if power is removed. Obviously the data loss can be significant because an entire file in RAM whose previously occupied space in flash memory has just been erased would be irrevocably lost if power were interrupted. Furthermore, all virtual mapping in RAM is also lost, and must be reconstructed by scanning a block usage map that resides at the top of each block. This process must also be executed at system startup.

The objectives of the Ban patent are highly desirable, but implementation using the technique of virtual mapping leaves any system using the Ban method not only vulnerable to significant data loss, but tied to a method which inherently cripples itself with overhead requirements. The result is a costly device which requires significant RAM resources, a powerful processor to manage the overhead, and a larger and heavier power source to supply the needs of the system. It seems that the benefits of flash memory, such as being non-volatile, small, fast, and a relatively conservative user of power are lost.

The present invention takes a very different approach to memory management. This new approach, embodied in a method and apparatus, overcomes the significant drawbacks of Ban. This is accomplished by taking advantage of the properties of flash memory, instead of treating them as a liability.

To understand the new method, it is necessary to have an understanding of the arrangement of the underlying hardware. The apparatus of the present invention is shown in block diagram form in FIG. 3A. As illustrated, the components of a system utilizing the memory management method of the present invention include an I/O device 30, a processor 32, a small cache memory 34 for temporary storage of data, and in a preferred embodiment, a relatively larger flash memory 36 for non-volatile, long-term storage of data.

Figure 3A:
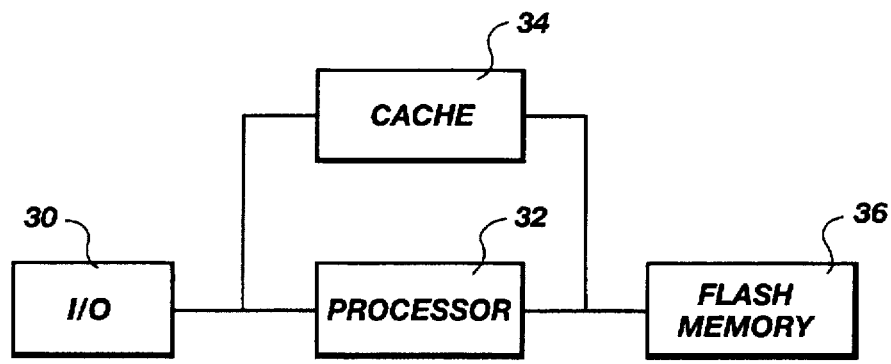
FIG. 3A is a block diagram of the components of a preferred embodiment of the present invention which utilizes the file system of the present invention.

What is important to understand about FIG. 3A which significantly differentiates the present invention from Ban is that the cache memory 34 in a preferred embodiment is only as large as a single read/write block of data as defined for the flash memory and to be explained in detail. The read/write block is typically as small as 256 bytes of data (but may be larger), and consequently the size of the cache memory 34 is also the same as the read/write block.

The size of the cache memory 34 is also constant in the present invention. This is also significantly different from Ban which admits that the size of RAM must grow accordingly relative to the size of flash memory provided by the system. This is because Ban uses RAM for memory mapping. More flash memory as primary memory in Ban requires an appropriately larger sized RAM, whereas this invention strictly uses a cache memory 34 to temporarily store a block of read/write data.

Having stated some of the most significant differences in physical structure of systems using the present invention and Ban, it is now possible to see how the method of this invention is able to significantly reduce overhead while increasing fault tolerance.

The file system of the present invention is adaptable to use many conventions of existing file structures of operating systems currently in use so that it may be considered hardware independent. This feature of portability is crucial in this day of multiple hardware platforms for storing digital data.

Figure 5:
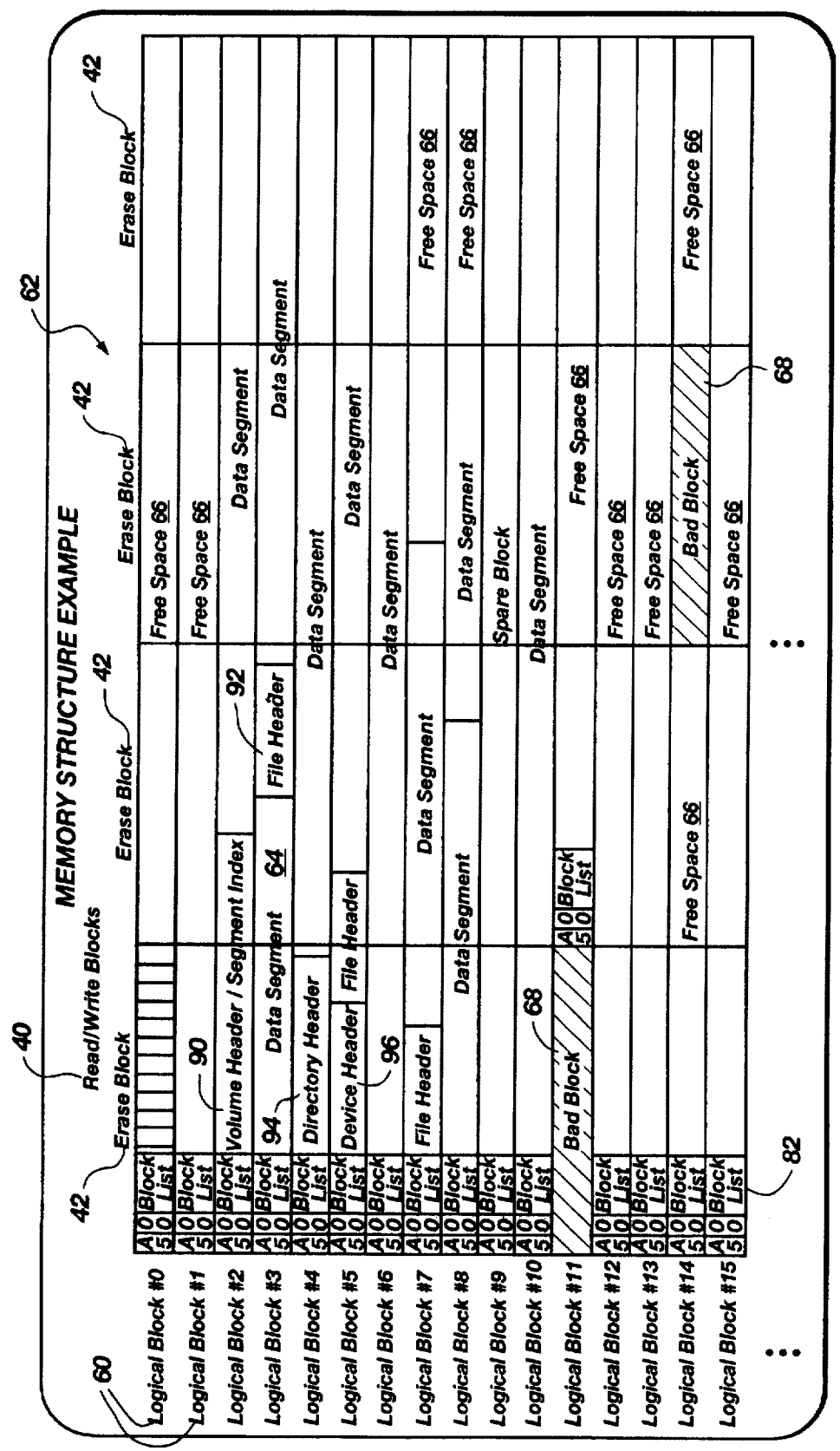
FIG. 5 is a block diagram of the logical memory structure which overlays the physical structure of FIG. 4. The illustration provides examples of Headers, Data Segments, Free Space and Bad Blocks which occupy memory in Logical Blocks.
Figure 6:
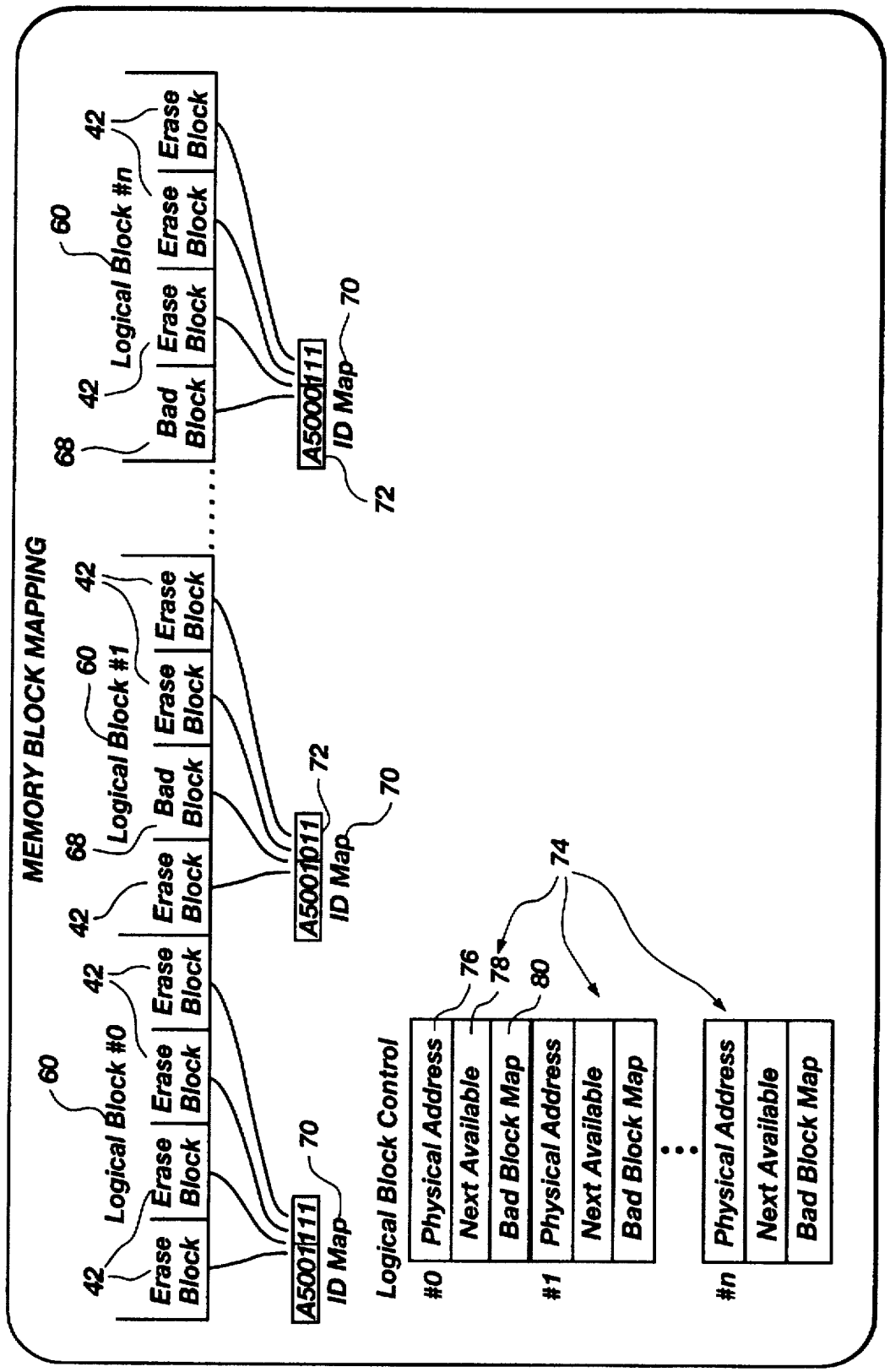
FIG. 6 is a block diagram illustrating Memory Block Mapping. Each logical block as defined in FIG. 5 contains a memory block map.

Therefore, the Norris Flash File System (referred to hereinafter as "file system") can also be viewed at different levels of implementation. That is to say, the file system is working at several different levels so as to be compatible with existing hardware. For example, there is a physical memory structure, memory block mapping, and a file system logical overlay of the physical memory structure as shown in FIGS. 5 and 6. There is also an hierarchy for cataloging data saved in the memory. For example, the file system is compatible with DOS found on many Intel microprocessor-based personal computers today. This is accomplished by including with the file system elements which make files saved by the file system recognizable to DOS, and by making it a "DOS installable file system" through the use of a DOS redirector. This also includes using DOS conventions such as a maximum of eight characters for a file name followed by a three character extension. More features of the file system, to be explained later, include implementation of an Application Program Interface (API) which consists of higher level file system function calls, as well as BIOS (hardware specific) function calls which execute the functions of the API calls at the hardware level.

The present invention also provides a file system which appears to have significant RAM resources, when in fact there is only a non-volatile long-term storage medium and a small cache, typically comprised of RAM.

As stated before, flash memory is chosen as the non-volatile long-terms storage medium of this preferred embodiment because of its desirable characteristics, and its limitations are then dealt with and overcome by the file system. However, it is imperative to understand the organization and limitations of the preferred memory.

Figure 4:
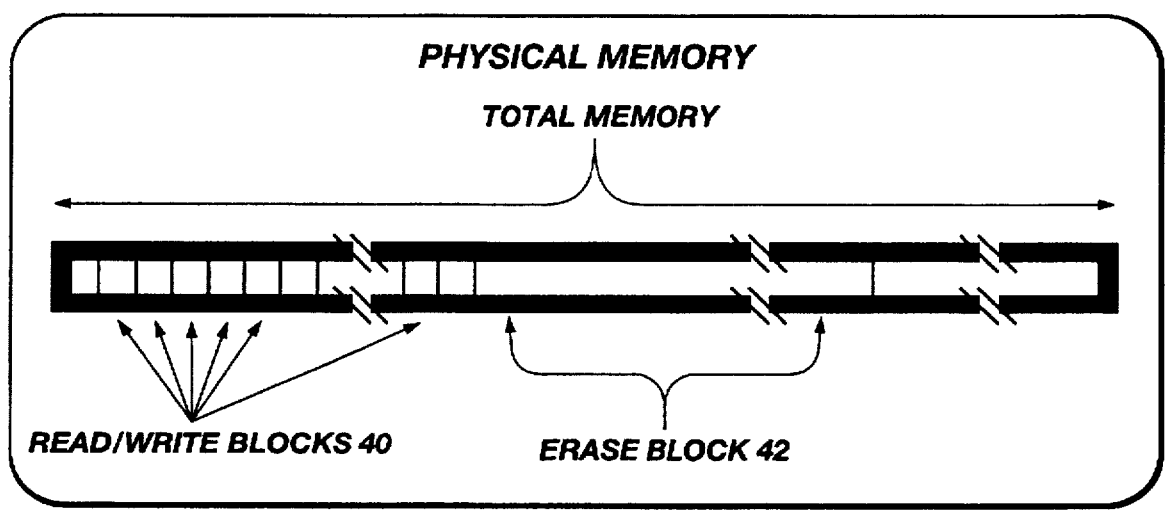
FIG. 4 is a block diagram of the physical structure of primary memory in a preferred embodiment.

Understanding the organization of any flash memory begins with FIG. 4 which is a diagram of memory structure used in the preferred embodiment. Shown at its simplest level, flash memory is divided up logically into blocks 40. A block 40 represents the smallest amount of physical memory which must be manipulated to accomplish a specific file system operation. The operations which concern this invention are reading, writing, and the particularly unusual requirement of erasure uniquely applicable to flash memory.

Typically, flash memory reads and writes to the same size block 40 of physical memory. However, erasing is a function that is presently limited to larger blocks 42. A typical erase block 42 is shown in relative proportion to the read/write blocks 40.

The specific size of the read/write and erase blocks 40, 42 are typically a function of the technology, capacity and vendor which is used for flash memory, as well as desired optimization of operation. There are presently several types of flash memory chips on the market, but two designs dominate the market. A first chip uses NAND technology and is presently the preferred type of memory for this invention. The second chip uses NOR technology. The specific attributes of these chips are summarized in the table below which contrasts typical 1 megabyte (8 megabit) NOR and NAND devices.

TABLE 1

| Type | Erase Block Size | Number of Erase Blocks | Read/Write Block Size | Number of Read/Write Blocks |
|---|---|---|---|---|
| NOR | 64K | 16 | 1 | 1M |
| NAND | 4K | 256 | 256 | 4K |

Figure 3B:
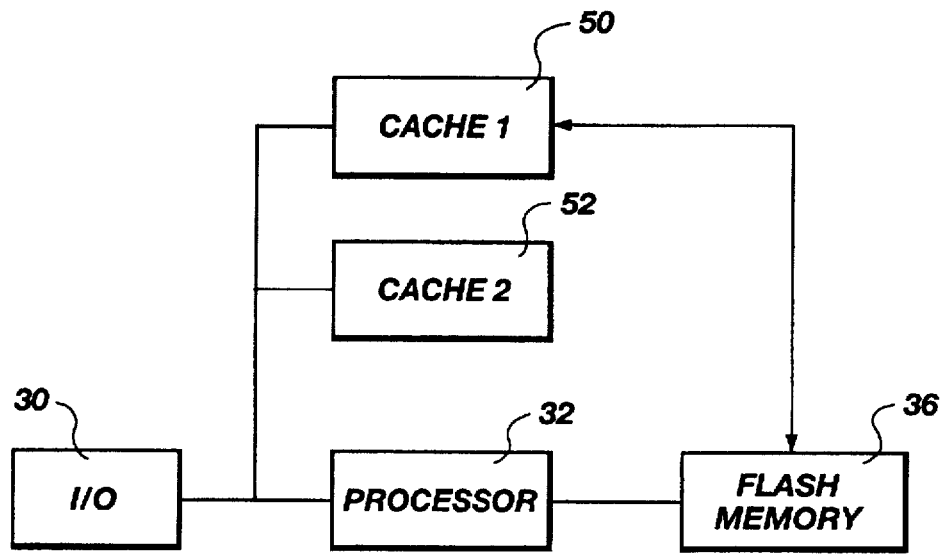
FIG. 3B is a block diagram of the components of an alternative embodiment of the present invention which utilizes a different buffering scheme than shown in FIG. 3A for utilization of the file system of the present invention.
Figure 3C:
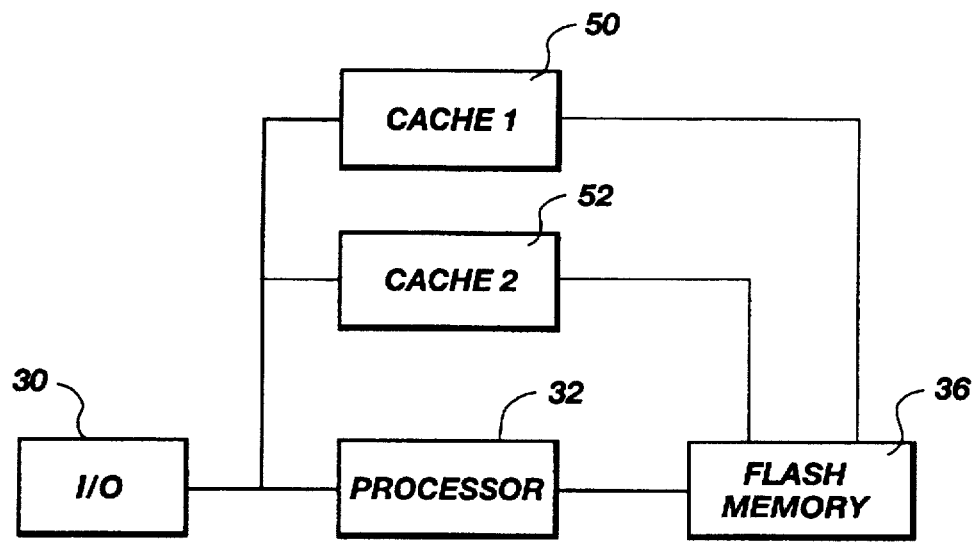
FIG. 3C is a block diagram of the components of another alternative embodiment of the present invention which utilizes a different buffering scheme than shown in FIGS. 3A or 3B for utilization of the file system of the present invention.

While Table 1 shows that the read/write block 40 size is 256 bytes in NAND flash memory, in practice it has been found that it is sometimes advantageous to buffer data as shown in FIG. 3B. Buffering data comprises using a first cache 50 memory for reading from and writing to a primary memory 30 while using a second cache memory 52 for storing data that is being processed. Advanced buffering includes making the two cache memories switch tasks as shown in FIG. 3C, allowing the file system to build or disseminate one buffer while another is written to or read from flash memory. It is important to note that NOR flash can actually read data from and write data to flash memory and process it without caching data, but for consistency in a preferred embodiment, the NOR and NAND technology flash memories are treated the same. Essentially, this leaves the NOR flash memory with double the normal size cache memory just for buffering of data if double buffering is implemented.

In comparison, conventional file systems of computer operating systems which don't use a system of paged memory, instead load the entire file into RAM for manipulation. Depending on the applicmegabytes, request file size could be multiple megabytes, requiring a correspondingly large RAM resource. For example, in a file creation mode, conventional operating systems build the entire file in RAM, and then copy the file to flash memory or some other long-term storage medium such as a hard disk when the creation of the file is complete. The obvious benefit of the file system, then, is avoiding the use of a large RAM resource and yet accomplishing typical file system functions as well as support features like editing that are normally performed in RAM. It should be observed that some large database applications use techniques such as partitioning to break the file up into more manageable pieces. These pieces are still very large and use large amounts of RAM.

The level of memory structure above the physical read/write and erase blocks 40, 42 is the logical memory structure shown in FIG. 5. In other words, the file system of the present invention advantageously organizes a logical memory structure over the physical memory structure. The logical layer maps "logical" blocks 60 onto the physical memory 62. Typically for NAND flash memory, a logical block 60 is composed of one or more erase blocks 42. Preferably, the physical memory 62 is divided into at least 1024 logical blocks 60, provided that 1024 erase blocks 42 are available.

While not apparent, the number of logical blocks 60 is important because it represents a key balance between performance and overhead of the file system. Having 1024 logical blocks 60 allows for an effective 0.1% erase block 42 (and bad block) granularity.

Thus, with larger read/write and erase block NOR flash memory, there is typically one logical block 60 for each erase block 42. With a 2 megabyte NOR flash memory, only 32 logical blocks 60 would be allocated. With NAND flash memory and a 4 kilobyte erase block size, only 512 erase blocks 42 exist, and only 512 logical blocks 60 could be allocated. However, increasing the NAND flash memory size to 8 megabytes, 1024 logical blocks 60 would be allocated, each containing 2 erase blocks 42. To calculate the number of erase blocks 42 per logical blocks 60, the inventors use the formula:

Blocks=$int$ (((Total memory/Size of erase block)+1023)/1024)

Each logical block 60 may also divided into one or more segments. Segments can be sized from a minimum of the read/write block 40 up to the maximum size of the logical block 60. As a rule, at least one segment is allocated for each file, file header, directory header, etc. Thus, large files that span multiple logical blocks 60 will have at least one segment for the file header and another segment for each logical block 60 only partially utilized. It should be apparent that a segment is sized according to the requirements of the data to be saved. As will be shown, different headers occupy different amounts of memory, and are coupled to different sizes of data segments.

The logical memory structure mapped to physical memory structure shown in FIG. 5 quickly illustrates some of the basic memory concepts explained above. As an example, a logical block 60 is comprised of four erase blocks 42, each of which are in turn comprised of a plurality of read/write blocks 40. Also shown are examples of occupied 64, free 66 and bad memory 68 segments.

A last memory principle requiring explanation is the file system concept of memory block mapping. Logical blocks 60 shown in FIG. 6 are comprised of up to four erase blocks 42. The memory block map indicates good erase blocks 42 and bad erase blocks 68. As indicated previously, a single bad bit within an entire erase block 42 renders the erase block useless because there is no way of preventing the system from writing to the bad bit, thereby corrupting data. A bad block 68 is indicated in the memory block ID mapping 70 as a 0 bit 72. As part of memory block mapping, a logical block control map 74 contains within it the beginning physical address of each block 76, the physical address of the beginning of the next available memory space within the logical block 78, and a map of bad blocks 80 within the logical block 60 to which data should not be written. The Memory Block Mapping is shown in FIG. 5 as the Block List 82 section of each Logical Block 60.

Keeping these aspects of memory structure in mind, it is now possible to discuss the type of data which is stored in primary and cache memory, but not yet how it is stored. As indicated previously, the file system stores more than simply data files. It is the organization of the memory which comprises a key point of novelty of the present invention. The file system is organized through the use of headers. Headers store most of the critical information which enables the file system to read data from memory, as well as to be able to search for data. While headers per se are not novel, the information stored in the headers of the file system create unique benefits to the user.

FIG. 5 which depicts the logical to physical memory structure, hinted at the use of headers when it showed Volume 90, File 92, Directory 94 and Device 96 Headers in Logical Blocks 2, 3, 4 and 5. In the preferred embodiment of the present invention, there are six possible header structures, and several other header-type data structures. The six headers listed in hierarchical relevance are the Device Header, Volume Header, Directory Header, File Header, Data Header, and the Tree Header.

The elements of the Device Header are shown in Table 2 below.

TABLE 2

| Name | Size | Type | Description |
|---|---|---|---|
| Segment ID | 2 | Word | Unique number assigned by system. |
| Size | 2 | Word | Number of bytes used after this field. |
| Type | 2 | Byte | A501h |
| Version | 2 | Byte | MSB: Major, LSB: Minor of formatting host. |
| Attributes | 2 | Word | DOS attributes & "deleted" attribute. |
| Hardware Configuration | 2 | Word | |
| Manufacturing Data Code | 2 | Word | |
| Lot # | 2 | Word | |
| Serial Number | 4 | DWord | |
| Erase Block Size | 4 | Dword | |
| Erase Block Count | 4 | DWord | |
| Logical Block Size | 2 | Word | Number of Erase Blocks per Logical Blocks |
| Creation Date/Time | 4 | Long | Seconds since January 1, 1980 |
| Erase-in-Process | 1 | Char | 00h-In process, 01h-Complete, FFh-Restore. |
| Delete-in-Process | 1 | Char | 00h-In process, 01h-Complete, FFh-Restore. |
| Number of Bad Blocks | 2 | Word | |
| Bad Block List | 2 × 32 | Word | Block numbers of bad blocks. |
| Reserved | 154 | Char | Reserved for Norris |

The Device Header, most importantly, contains information relevant to the hardware of the particular primary memory medium being organized by the file system. The file system looks to the Device Header when it creates the logical memory layout over the physical memory as discussed previously. For example, the erase block size 42 and logical block size 60 are written here. FIG. 5 correctly shows only a single Device Header 96 in memory, because there is typically only one type of flash memory or any type of primary memory used at one time. More plainly, this means it is not possible for the file system in a preferred embodiment to control both a NAND and NOR flash memory simultaneously. Nevertheless, by providing a Device Header 96, it is possible to implement a combination of the two.

The next most relevant header structure is the Volume 90 Header. The elements of the Volume Header are shown below in Table 3.

TABLE 3

| Name | Size | Type | Description |
|---|---|---|---|
| Segment ID | 2 | Word | Unique number assigned by system. |
| Size | 2 | Word | Number of bytes used after this field. |
| Type | 2 | Byte | A502h |
| Version | 2 | Word | MSB: Major, LSB: Minor of formatting host. |
| Attributes | 2 | Word | DOS attributes & "deleted" attribute. |
| Name | 11 | Char | DOS Volume Name |
| (filler) | 1 | Char | |
| Creation Date/Time | 4 | Long | Seconds since January 1, 1980 |
| Description | 20 | Char | |
| Access Password | 20 | Char | |
| Read Password | 20 | Char | |
| Reserved | 42 | Char | Reserved for Norris |
| Primary Segment Index | 2 × 32 | Struct | Entries vary with number & size of Logical Block |
| Next Segment Index | 4 | DWord | Address of First Secondary Segment Index. |

The Volume Header information pertains principally to the logical mapping memory structure shown in FIG. 5. The Volume Header is easily analogized to the format information of a typical hard disk or floppy disk medium. Until formatted, a hard disk is useless to an operating system's file system. Formatting provides the logical structure overlay which a file system uses to determine the logical and corresponding physical location of data stored therein. Therefore, an element of the Volume Header is the expected DOS volume name. Typically, the present invention also requires only a single Volume Header 90 for the selected memory medium.

Beneath the Volume Header 90 in hierarchical structure comes the Directory Header 94. Those familiar with DOS are familiar with a root directory essentially being the root node from which branch various subdirectories. Directories are created so as to organize related data files. However, the root directory in DOS is no different in structure than a subdirectory which resides in the root directory, except for its logical location. Similarly, a first Directory Header 94 forms the root directory of the file system. All subsequently created directories are logically located within the root directory. The elements of the Directory Header are listed in Table 4 below.

TABLE 4

| Name | Size | Type | Description |
|---|---|---|---|
| Segment ID | 2 | Word | Unique number assigned by system. |
| Size | 2 | Word | Number of bytes used after this field. |
| Type | 2 | Byte | A508h |
| Version | 2 | Word | MSB: Major, LSB: Minor of formatting host. |
| Attributes | 2 | Word | DOS attributes & "deleted" attribute. |
| Owner ID | 2 | Word | Segment ID of Directory Header (0 if root). |
| Directory ID | 2 | Word | Unique number assigned by system. |
| Name | 8 | Char | DOS file name. |
| Extension | 3 | Char | DOS file extension. |
| (filler) | 1 | Char | |
| Creation Date/Time | 4 | Long | Seconds since January 1, 1980 |
| Description | 20 | Char | |
| Access Password | 20 | Char | |

TABLE 4-continued

| Name | Size | Type | Description |
|---|---|---|---|
| Read Password | 20 | Char | |
| Reserved | 38 | Char | |

Like DOS filenames, directories are also comprised of a maximum eight character name, and three character extension.

The Device, Volume and Directory Header 96, 90, 94 described above are the minimal file structure Headers that must exist for the file system to operate. The Device, Volume and a root Directory Header 96, 90, 94 are thus created when a flash memory device is first initialized. These Headers all exist, however, to support the file structure in being able to logically and physically store data, which is the purpose of the file structure. It is left to the Header File 94 structure to actually begin storing data.

The elements of the File Header are shown in Table 5 below.

TABLE 5

| Name | Size | Type | Description |
|---|---|---|---|
| Segment ID | 2 | Word | Unique number assigned by system. |
| Size | 2 | Word | Number of bytes used after this field. |
| Type | 2 | Byte | A510h |
| Version | 2 | Word | MSB: Major, LSB: Minor of formatting host. |
| Attributes | 2 | Word | DOS attributes & "deleted" attribute. |
| Owner ID | 2 | Word | Segment ID of Directory Header |
| File ID | 2 | Word | Unique number assigned by system. |
| Name | 8 | Char | DOS file name. |
| Extension | 3 | Char | DOS file extension. |
| (filler) | 1 | Char | |
| Creation Date/Time | 4 | Long | Seconds since January 1, 1980 |
| Data Type | 2 | Word | |
| Description | 20 | Char | |
| Access Password | 20 | Char | |
| Read Password | 20 | Char | |
| Author ID | 2 | Word | ID assigned to author. |
| Job Number | 2 | Word | Job number. |
| Priority Level | 2 | Word | Job priority |
| Transcriber ID | 4 | DWord | |
| Reserved | 26 | Char | |

Notable additions to the elements are a data type and description. One File Header 92 precedes every data file within the file system regardless of the number of data segments required to store the file data.

Closely connected to the File Header is the Data Header. The elements of the Data Header are found listed in Table 6 below.

TABLE 6

| Name | Size | Type | Description |
|---|---|---|---|
| Segment ID | 2 | Word | Unique number assigned by system. |
| Size | 2 | Word | Number of bytes used after this field. |
| Type | 2 | Byte | A520h (data)/A521h (erasure) |
| Version | 2 | Word | MSB: Major, LSB: Minor of formatting host. |
| Attributes | 2 | Word | DOS attributes & "deleted" attribute. |
| Owner ID | 2 | Word | Segment ID of File Header. |
| Data size | 2 | Word | Size of user data. |
| Insert ID | 2 | Word | Segment ID to insert this data (FFFFh = beginning). |
| Insert Offset | 2 | Word | Offset within insert Segment's data. |
| Edit Date/Time | 4 | Long | Seconds since January 1, 1980 |
| Reserved | 42 | Char | |

The Device, Volume, Directory, File and Data Headers form the basis for the file system. In might be thought that these are sufficient to organize data within any file system. However, to stop here ignores the perils of flash memory. Therefore, the file system, to be adaptable to any storage medium, must contain sufficient structure to adapt to flash memory even if not used by other storage media.

If flash memory is to serve as primary memory with a relatively small RAM resource which cannot easily be used for data manipulation, the file system must also provide a method for easily accessing the data stored in flash memory. Providing easy access is what makes the use of flash memory an advantage instead of a liability.

The present invention uses two additional header structures to enable the file system to see flash memory as RAM. They are the Tree Header and a header-like data structure, the Tree Node. These structures are listed below in Tables 7 and 8 respectively.

TABLE 7

| Name | Size | Type | Description |
|---|---|---|---|
| Size | 2 | Word | Number of bytes in header |
| File ID | 2 | Word | Message ID of file |
| First Node | 2 | Word | Address of first node in tree |
| Next Tree | 2 | Word | Address of next tree header |

TABLE 8

| Name | Size | Type | Description |
|---|---|---|---|
| Size | 2 | Word | Number of bytes in header. |
| Next Node | 2 | Word | Address of next node in tree. |
| Start Data ID | 2 | Word | Segment ID of starting Data Segment. |
| Start Data Pointer | 2 | Word | Address of starting Data Segment. |
| Start Data Offset | 4 | DWord | Starting offset within starting Data Segment. |
| End Data ID | 2 | Word | Segment ID of ending Data Segment. |
| End Data Pointer | 4 | DWord | Address of ending Data Segment. |
| End Data Offset | 2 | Word | Ending offset within ending Data Segment. |

The Header structures described in Tables 2 through 8 are the minimum essential elements of the file system required to be able to organize data such that it can be saved and recalled from primary memory. However, access to data does not necessarily mean that the access provided by the file system is sufficiently rapid in real-time for particular applications.

For example, the file system of the present invention is particularly useful for the flash memory used as primary memory in U.S. Pat. No. 5,491,774 for a HANDHELD RECORD AND PLAYBACK DEVICE WITH FLASH MEMORY by Norris et al. This patent is incorporated by reference herein, and provides a detailed example of the benefits of flash memory in a portable recorder. The essential feature of playback provided by the handheld recorder illustrates the requirement for real-time recall of data. In particular, it was mentioned that there are two methods of memory storage, organized by time or by subject matter. A recording device typically operates by storing data serially (sequentially) by time only. However, it should now be apparent that organizing voice messages by subject matter is now possible.

To facilitate rapid recall of data, it is not enough that the present invention provide a novel method and apparatus for sequential recall of logically ordered data. To show that the features of RAM are actually provided by the present invention, real-time implementation requires rapid data recall. This method is implemented and assured through the use of the Tree Header and Tree Node.

The Tree Header and the Tree Node are a novel and essential part of the file system. The information stored therein is used to facilitate rapid data access to more accurately imitate the abilities of RAM through the use of a playback tree structure.

The last header structures of the present invention are the Segment Index Entry and the Secondary Segment Index whose members are shown in Tables 9 and 10 respectively.

TABLE 9

| Name | Size | Type | Description |
| --- | --- | --- | --- |
| Segment ID | 2 | Word | ID of Segment |
| Type | 2 | Word | Segment Type (Directory, file, data, etc ...) |
| Next ID | 2 | Word | ID of next Segment in chain (FFFFh = end) |
| First ID | 2 | Word | ID of first Segment in chain (FFFFh = end) |
| Address | 4 | DWord | Physical address of Segment |

TABLE 10

| Name | Size | Type | Description |
| --- | --- | --- | --- |
| Segment ID | 2 | Word | Unique number assigned by system. |
| Size | 2 | Word | Number of bytes used after this field. |
| Type | 2 | Byte | A504h |
| Version | 2 | Word | MSB: Major, LSB: Minor of formatting host. |
| Attributes | 2 | Word | DOS attributes & "deleted" attribute. |
| Segment Index | 12 × ? | Struct | Entries vary with block size & chips used. |
| Next Segment Index | 4 | DWord | Addressed of next Secondary Segment Index. |

The Segment Index Entry is an element of every Header structure shown above, and provides essential data structure linkage to be explained. The Secondary Segment Index fulfills the function of The disclosure to this point has merely hinted at the potential of the file structure. The building blocks of the file structure have at least now been sufficiently explained such that their implementation as parts of the file structure can be observed more closely at a functional level.

Figure 7A:
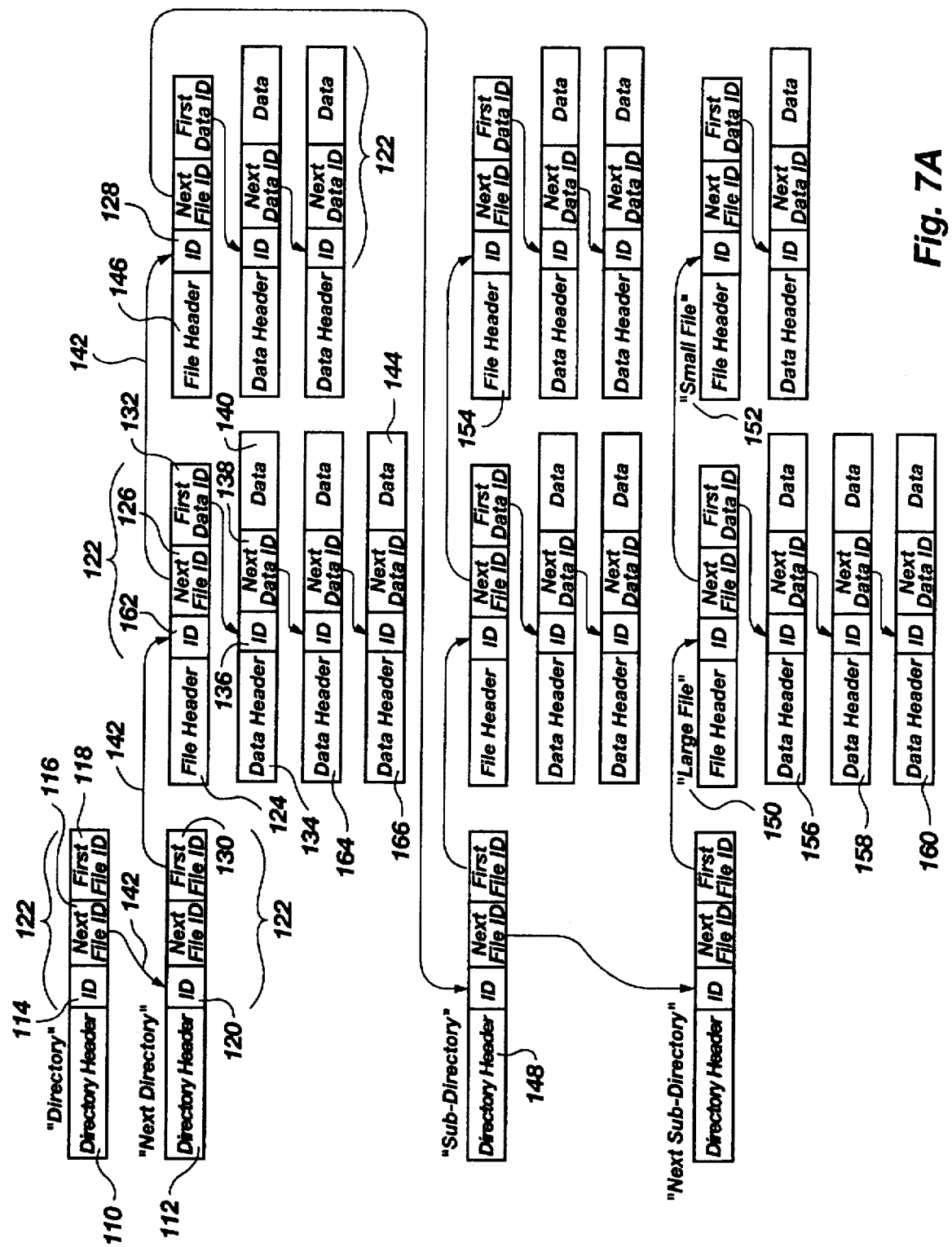
FIG. 7A is a functional diagram of the data structure linkage implemented in a preferred embodiment of the file system of the present invention.

The functional description should begin with a look at how some of the Headers are logically linked to accomplish the objects of the present invention. To that end, FIG. 7A is a functional diagram of the data structure linkage in a preferred embodiment. The preferred embodiment includes logically linking data segments by subject matter where directories are used to define different subjects. This is opposed to linking data segments organized only by the order in which they were recorded.

Essentially, Headers and the file and data segments to which they are appended are all linked in a manner which provides sequential recall of data organized by subject matter. It is easy to see how this concept is important to the Norris Patent by observing that data segments which represent portions of a single voice message but saved noncontiguously in memory must be recalled as they were spoken. In a like manner, several discrete but logically related voice messages could be played back in sequence if logically stored in the same directory. It is the limitation of memory file fragmentation which causes voice data not to be stored sequentially, and thus complicating playback. The file system as shown in FIG. 7A enables logical data recall.

Figure 7B:
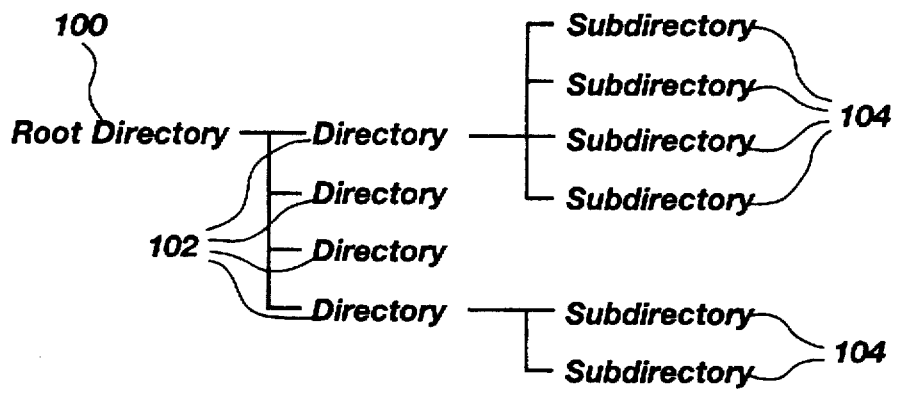
FIG. 7B is a representation of a DOS file structure depicting a root directory, directories within the root, and subdirectories within the directories.

Referring first to FIG. 7B, a representation of a DOS file structure is shown for illustration purposes. The lowest level of the file structure is the root directory 100. Within the root directory 100 is at least one directory 102, but there may be many more. Within each directory 102 a variable number of subdirectories 104 may also be created which typically contain subsets of data related to the directory in which they are located.

Referring back to FIG. 7A, the Directory Headers 110 and 112 may be considered to be directories 102 within the root directory 100 of FIG. 7B. While table 3 shows all of the information stored in the Directory Header, the essential functional linkage information is shown as the ID 114, the Next File ID 116, and the First File ID 118. These functional fields correspond to the fields in the Segment Index Entry 112 of Table 9 which, as stated above, is appended to every Header.

As shown, the Next File ID 116 provides a pointer to the next Directory Header ID 120. Thus, the Next File ID 116 can be thought of as being more accurately referred to in the Directory Header 110 as a "Next Directory ID". However, functionally, the Directory Header 110 is just another file, so the label is still appropriate, and so the label is kept for the sake of consistency only. The First File ID 118 is naturally associated with an actual File Header.

As shown in FIG. 7A, File Headers also have an appended Segment Index Entry such as File Header 124. However, two fields have different functions. The Next File ID 126 actually points to a next File Header ID 128 within the Directory 112, instead of pointing to another Directory. The First File ID 130 has also been replaced with the First Data ID 132. This field, as shown, points to a Data Header 134 having and ID 136, a Next Data ID 130, and an actual data field 140.

While the data structure linkage illustrated functionally in FIG. 7A appears rather straightforward, with directories pointing to other directories or files within themselves and the files in turn pointing to related data, there are still several features which are not obvious, and bear explanation to fully understand the advantages of the present invention.

For example, while the linkage shows how to move down through the layers of directories, subdirectories, files and data segments, the arrows 142 are distinctly unidirectional. That is, they only point down a link, but not back out. It was stated rather simplistically before that all data within the primary memory was sequentially linked. This might lead one to believe that FIG. 7A is then in error, because the last data segment of a data header such as data segment 144 does not point to the beginning of a next file or directory. On the contrary, File Header 124 and not the Data Header 134 is shown to point to a subsequent File Header 146 and to a Directory (subdirectory) Header 148. The reason for the more complicated linkage structure and the method for providing backward linkage are as follows.

When it was stated that the present invention is distinctly suited for the handheld recorder of the Norris patent, that is because a dedicated recording device using a magnetic storage tape does not require a very complicated hierarchical data linkage structure. All messages can only be stored serially (sequentially). However, a more sophisticated data structure can provide the ability to put all recorded voice messages related to a certain topic within a particular directory so that recall can be facilitated by looking for subject matter. Likewise, an even more detailed data structure might wish to further categorize subjects within a single subject by providing subdirectories within a directory. Therefore, it is more advantageous for the file system to be able to logically link related data segments within directories and subdirectories, rather than link data segments in the exact time sequence order in which the data was recorded.

Therefore, in a voice recorder such as the one taught by Norris, if the user records a first message regarding topic A, then records a second message regarding topic B, then records a third message regarding topic A, it would be more advantageous to provide a method and apparatus such as the present invention for logically linking the first and third messages together within the same directory such that the first and third messages could be played sequentially without also playing the second message. For example, in FIG. 7A, the first message could be the "Large File " 150, the third message could be the "Small File" 152, and the second message could be File Header 154.

Throughout all of the discussion above, it is imperative to remember that the present invention makes it possible to recall data which is likely not to be stored contiguously in primary memory. This enables the present invention to ignore the sequence in which messages were recorded, thereby facilitating subject matter organization of files. More specifically, the headers of the present invention are written so as to contain pointers which point to files which a user deems to be logically related to by subject. Therefore, while each Directory Header, File Header, and Data Header is comprised of a contiguously stored data segment in memory, logically related data segments such as 156, 158 and 160 may be physically stored in very different locations in memory. This is very advantageous because trying to move data so that all logically related segments 156, 158 and 160 all reside in contiguous memory would be a very heavy overhead burden on a processor which is otherwise engaged in playback or digitizing and compression of the voice messages.

Having discussed the advantages of providing the data structure of FIG. 7A, it is still necessary to discuss how the present invention provides necessary backward linkage. Specifically, being able to get down to File Header 124 leaves the task of getting back out to Directory Header 112 so as to be able to access other directories and files. This recursive searching is accomplished through the ID field such as 114, 120, and 162. By tracking ID fields and their absolute physical locations in primary memory, it always possible to go back "up" a link just as easily as it was to move down the link. One possible implementation of this linkage is to create a "Last In, First Out" (LIFO) stack.

Figure 8:
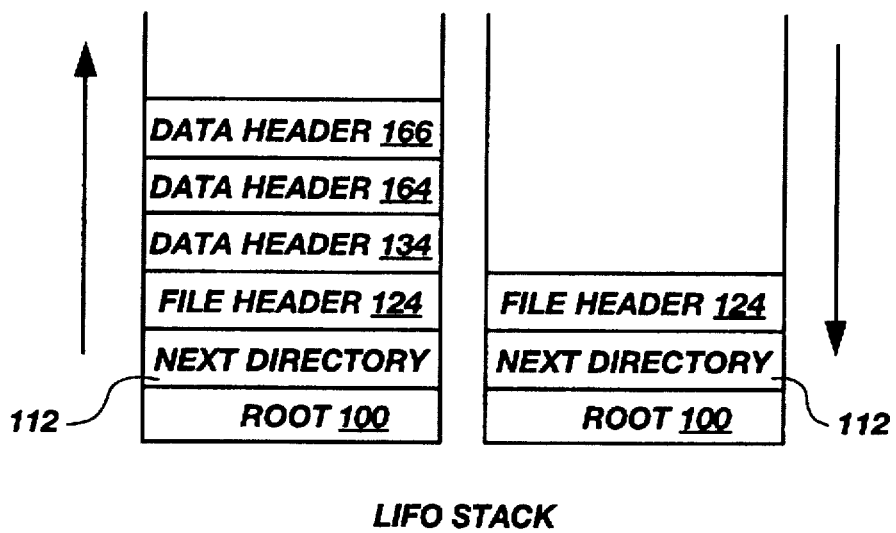
FIG. 8 is a LIFO stack which represents one implementation of a recursive search method for moving backward through data stored in memory.

For example, assume the first entry in the LIFO stack is always the location of the root directory "Directory Header" 100 as shown in FIG. 8. Following the route illustrated in FIG. 7A, the next entry would be the location of the next directory Directory Header 112. The user then went into a file 124 within the next directory 112. At this point, if the user went down into the file, subsequent stack entries would be pointers to sequentially subsequent Data Headers 134, 164 and 166. When the last Data Header 166 in the file 124 was reached, the user simply backs out of the LIFO stack by pulling from the stack the absolute location in memory of previous headers until reaching a Header which provides either the location of the next file within the directory, or the user continues backwards through the LIFO, popping off addresses of hierarchically greater Headers until reaching the desired branching point shown in FIG. 8 as the File Header 124. Those skilled in the art will appreciate other methods of backward linkage.

The discussion above has focused on the data linkage structure which provides the framework for the file system to move from data segment to data segment, backwards or forwards as desired. Forward linkage is accomplished by looking to Next File IDs, First File IDs, and First Data IDs shown in FIG. 7A. Backward linkage may be accomplished through such techniques as a LIFO stack. However, another file system structure is provided by the present invention when previously recorded data is to be recalled. For example, if a voice message is to be played, if a new voice message is to be inserted within an existing message, or if an existing portion of a message is to be deleted, these operations all take place in a tree structure in a portion of primary memory permanently set aside for manipulating data in these ways. A playback tree structure provides a place in memory without any Directory Headers or otherwise irrelevant data which has nothing to do with the task of manipulating a particular data segment, in this case a voice message.

Figure 9:
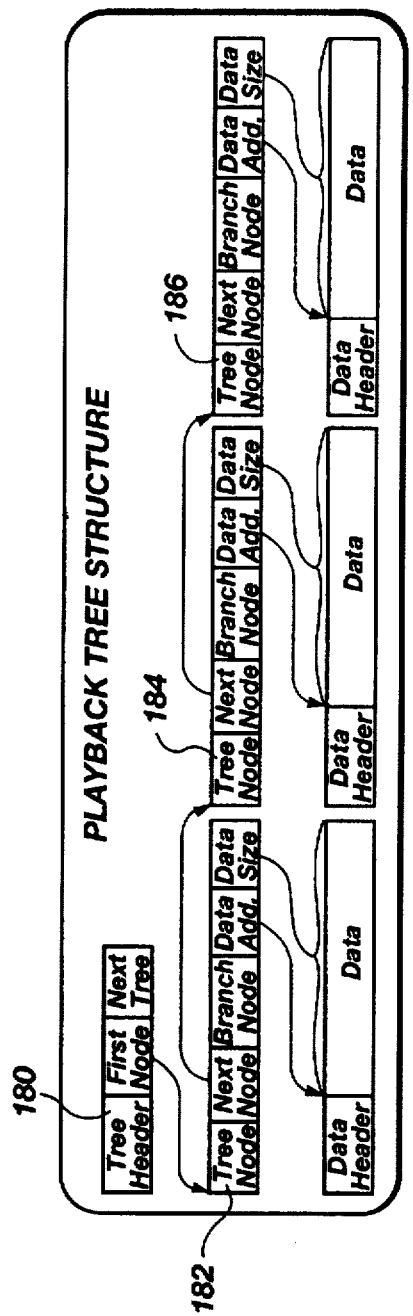
FIG. 9 is a functional representation of a playback tree structure as implemented in the present invention.

For example, a playback tree structure as implemented in the present invention is shown in FIG. 9. The figure shows a playback tree which is used to logically recall data which is probably not stored sequentially in physical memory. As stated previously, the present invention is ideal for recalling data which has been stored in a critical sequence. The nature of file fragmentation typically precludes related data from being stored contiguously.

As shown in FIG. 9, the playback tree has a single Tree Header 180 and at least one Tree Node 182, 184, 186, but typically many more. The playback tree essentially functions as a shorthand method of recalling data. In the case of the handheld recorder of Norris, the data represents recorded voice messages. Data must be recalled at a fairly consistent rate to provide accurate voice or sound reproduction. Rapid data recall is implemented in a preferred embodiment by setting aside an area of primary memory as "work" memory. Work memory is reserved at all times for playback trees. The work memory essentially becomes a mirror of the structure of File and Data Headers in primary memory.

One of the novel advantages of the present invention includes a method for seamless insertion of a voice message within another voice message. Seamless insertion means that a user can interrupt an existing voice message at any point, record a new message, and play back the existing message with the new message seamlessly interrupting the existing message at the point the new message was recorded, and then continuing on with the rest of the existing message when the new message finishes playing. The present invention accomplishes this advantageous and seamless insertion process through the use the headers already explained above. More specifically, however, the present invention uses the functional structure in FIG. 10.

Figure 10:
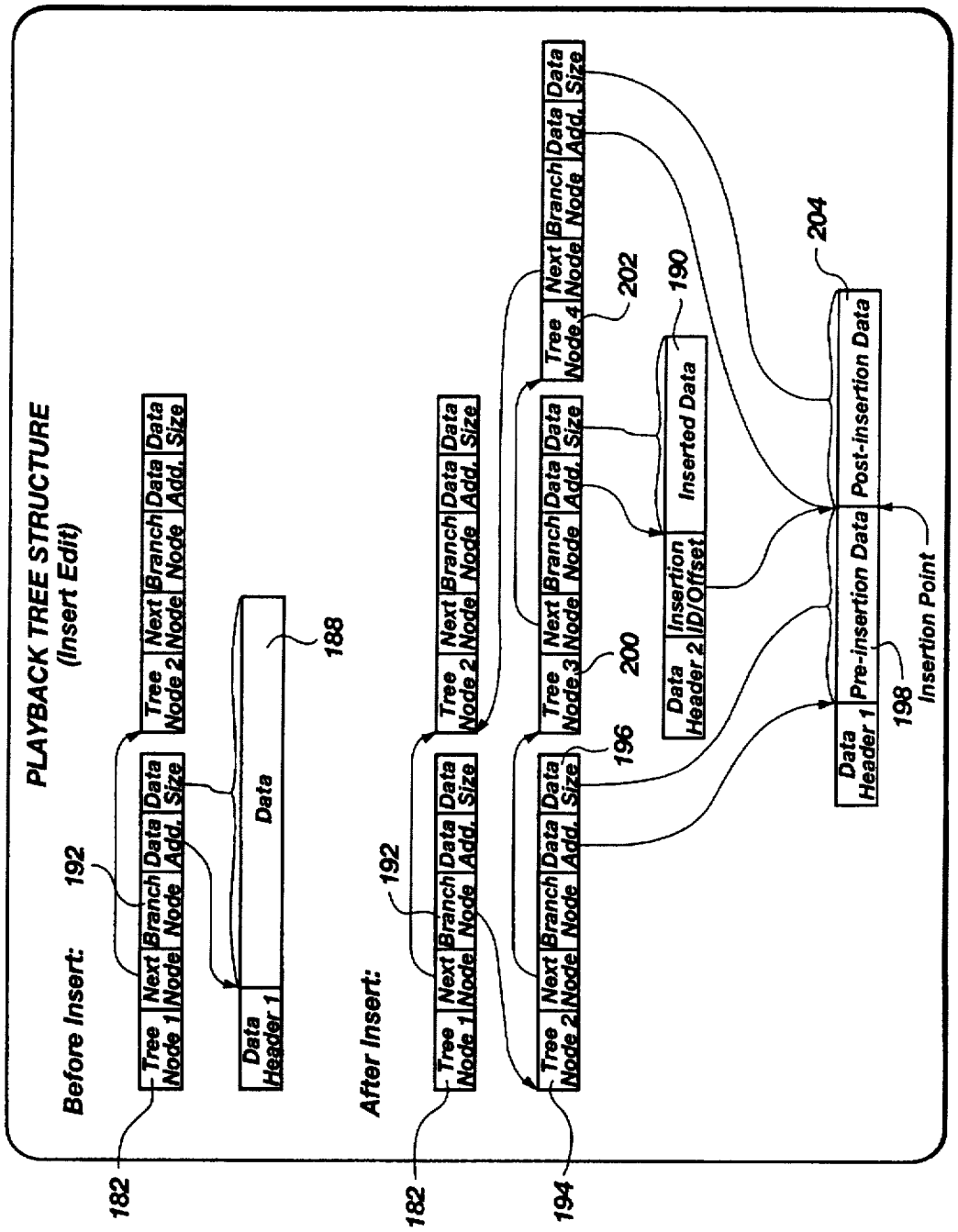
FIG. 10 provides a functional diagram of a playback tree before insertion of a new message within an existing message, and after insertion of the new message as implemented according to the principles of the present invention.

FIG. 10 provides a functional diagram of a playback tree before insertion of a new message 190 within an existing message 188, and after insertion of the new message 190. Normally, the branch node 192 of a tree node is not used. However, when a message is inserted, Tree Node 1 (182) branches to Tree Node 2 (194). The Data Size field 196 is modified to reflect the portion of the original message to be played up to the insertion point, referred to as pre-insertion data 198. After the shortened data segment 198 has been played, Tree Node 2 (196) branches to Tree Node 3 (200). Tree Node 3 consists of the inserted message 190. Finally, Tree Node 3 branches to Tree Node 4 (202) which consists of a data segment which is all of the original message after the insertion point, referred to as Post-insertion data 204.

If the playback tree structure is then to be used to play back the entire new message consisting of data segments 198, 190 and 204, the message would seamlessly play the data segments as if the message consisted of a contiguously stored message comprised of Pre-insertion Data 198, Inserted Data 190, and Post-insertion Data 204.

Figure 11:
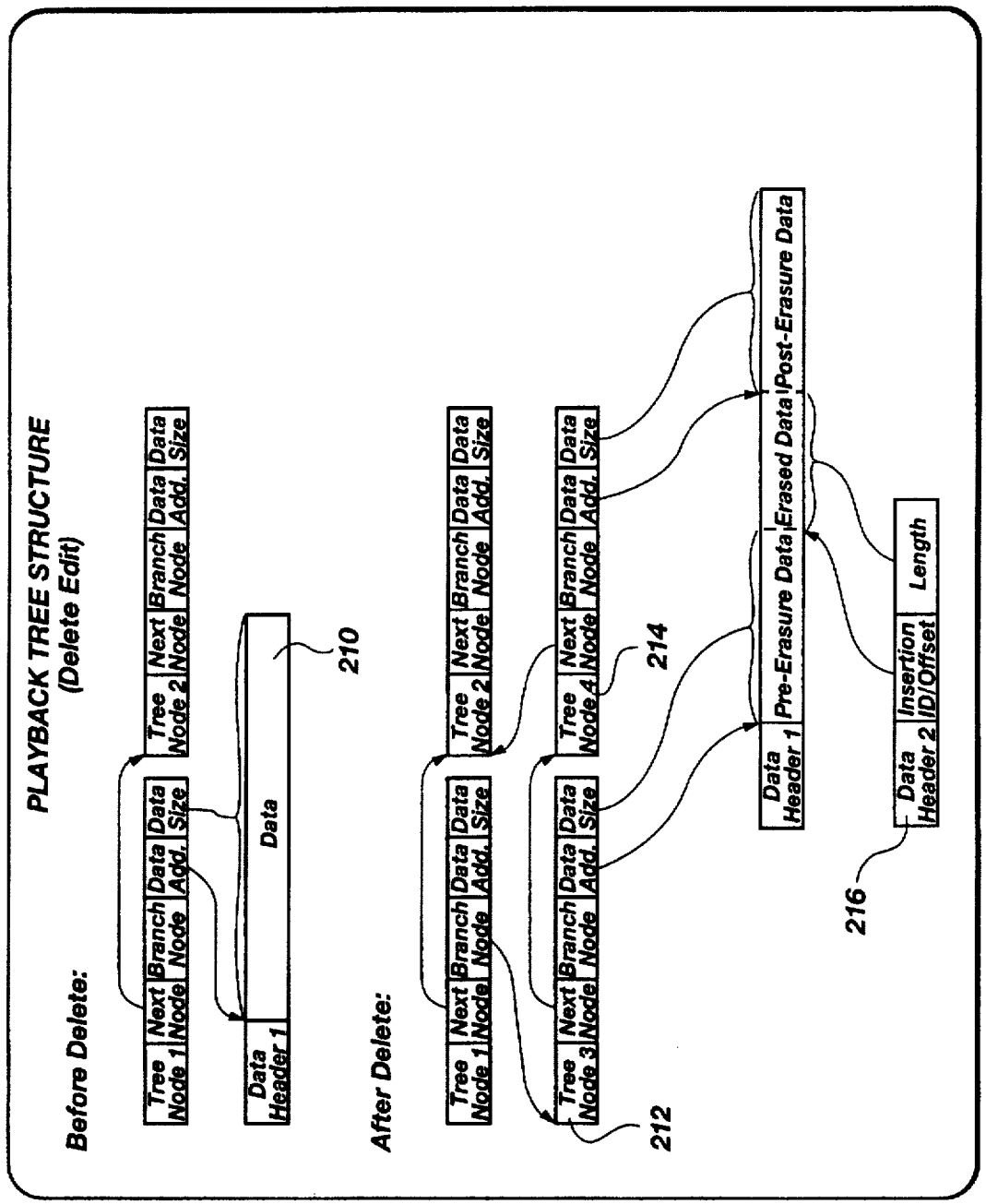
FIG. 11 illustrates a pre-existing message before and after message deletion as implemented according to the principles of the present invention.

The process above is essentially the same used for deleting or editing out a portion of an existing message. FIG. 11 illustrates a pre-existing message 210 before and after message deletion. The message structure 210 before deletion is essentially the same as before insertion of a message as shown in FIG. 10. However, instead of creating a Tree Node for the inserted data, as well as for the Pre and Post insertion segments, only Pre and Post erasure Tree Nodes 212 and 214 are created. Data Header 2 (216) is created to keep track of the deleted data for edit history purposes. This is critical when using flash memory, because the data must eventually be ercan be sore new data can be stored in the same physical memory space. By keeping track of what memory is used, free and marked for erasure, flash memory space can be optimized.

The description of the present invention given above has focused on describing it at a functional level. Still to be described are the Application Program Instructions (APIs) which carry out the high level function calls to implement the functional operations already described.

Table 11 summarizes all APIs implemented by the file system of the present invention. These instructions are executed by the file system in response to commands received by a processor. These API commands can be considered to be "high level" instructions executed by the file system to manipulate files stored in primary and cache memory. To understand how these API function calls operate, an example will now be given which utilizes each of the calls so as to clearly illustrate proper use and important features.

TABLE 11

| Function | Description |
| --- | --- |
| nfsChDir | Change the current directory |
| nfsClose | Close a file |
| nfsCreate | Create a file |

TABLE 11-continued

| Function | Description |
| --- | --- |
| nfsDelete | Delete a file |
| nfsErase | Erase data within a file |
| nfsFind | Find a file (first, next, etc.) |
| nfsGetAttr | Retrieve the DOS attributes of a file |
| nfsGetItem | Retrieve selected information items from a file |
| nfsGetsystem | Retrieve global file system parameters |
| nfsInitialize | Setup NFS and optionally erase or reorganize user data |
| nfsLength | Return the length of a file's data |
| nfsMkDir | Make a new subdirectory |
| nfsOpen | Open a file |
| nfsOptimize | Erase & pack all unused space |
| nfsRead | Read data from a file |
| nfsRename | Rename a file |
| nfsRmDir | Remove a subdirectory |
| nfsSeek | Seek to a position of data within a file |
| nfsSetAttr | Change the attributes of a file. |
| nfsSetItem | Change selected information items in a file |
| nfsSetSystem | Set global file system parameters |
| nfsStat | Obtains information about a file |
| nfsTell | Return the current position within a file |
| nfsWrite | Write date to a file |

The first API executed is Initialize. This API is activated when power is first applied to a device utilizing the flash file system of the present invention. It might be easier to conceptually visualize the API as two different commands in DOS. They are the format command and the fdisk command. In other words, when a power switch is toggled on, the Initialize API prepares the file system for operation. Preparation includes bulk erasure of the flash memory if the memory has been previously marked for bulk erasure. This is the format aspect.

Initialization also includes the process known as the fdisk command. In DOS, fdisk partitions the medium and divides the medium into sectors so that the FAT can map files to specific predefined sector addresses. Fdisk also creates the initial root directory to which all directories, subdirectories and files within them can trace their origin.

The process of initialization also includes the process of placing in cache memory a "message pointer" which can be analogized to a cursor in memory. Just as a cursor indicates where insertion or deletion of data is to occur, the message pointer is a cursor in primary memory which indicates where reading or modification of data will occur if executed. Upon initialization, the message pointer is located at the root directory.

The concept of a message pointer is crucial to the present invention because of the sequentially and logically linked data segments of the present invention. Initialization of the file system thus includes the step of determining a current position of the message pointer in primary memory. Initialization also includes the step of first creating a Directory Header if a bulk erase function call was executed. A Directory Header to a root directory can be considered to be the lowest minimum setup of the file system if no files or subdirectories yet exist.

After initialization of the file system, it will be assumed for this example that no data presently exists in flash memory. At this point, the user has the options of creating a directory within the root directory (essentially every directory created by the user is a subdirectory of the root directory), create a file within the root directory, or carry out some utility function call other than one which acts upon data which presently exists, because no file has yet been created. Creating a directory is the nfsMkDir (Norris File System Make Directory) command which creates a subdirectory in the current directory. Creating a file is the nfsCreate command which involves the steps of creating a new file, opening a file in the current file system, writing a file header and preparing for the writing of data.

The utility functions which can be executed without files existing include changing the current directory with nfsChDir, retrieving global file system parameters with nfsGetSystem, erasing and packing all unused space with nfsOptimize, and setting global file system parameters with nfsSetSystem.

The nfsChDir requires that the specified directory must reside in the current directory, and the directory's ID is used to locate it if the file pointer does not already have the directory's address. The nfsOptimize process erases and packs data segments to recover unused space. It is important to note that premature interruption of the process compromises file structure integrity. The optimize process must begin again to restore the file system to a usable condition without loss of data.

The remaining APIs almost exclusively perform some function call on files which have now been created. The API of nfsClose for closing a file which flushes and closes if a data segment is currently open for calls to nfsWrite, and nfsDelete for deleting a file which marks file and data header to signify deletion and which does not affect data until an optimization is done. Furthermore, if specified in the global flags, the optimization will be performed automatically upon deletion of a file. The function call of nfsErase for erasing data within a file marks a section of data in the current file as deleted. Specifically, "erased" data is marked from the position specified by lStart for the number of bytes specified by lSize as represented by the presentation map created by nfsOpen.

The function call nfsFind or finding a file (first, next, etc.) finds the file specified in the current directory, and has the user selectable options of finding the first name, finding the first file in the current directory, finding the last file in the current directory, finding the next file following any previously used file, finding the file preceding any previously used file, finding a normal file, finding a read-only file, finding a hidden file, finding a system file, and finding a subdirectory.

The function call nfsGetAttr retrieves the DOS attributes of a file from the DOS attributes flags of the current file. The DOS attributes flags are found in Table 12 below.

TABLE 12

| Name | Size | Type | Description |
| --- | --- | --- | --- |
| Read Only Flag | 1 | Bit 0 | Set if file has 'Read Only' attribute. |
| Archived Flag | 1 | Bit 1 | Set if file has 'Archived' attribute. |
| Hidden Flag | 1 | Bit 2 | Set if file has 'Hidden' attribute. |
| System Flag | 1 | Bit 3 | Set if file has 'System' attribute. |
| Unused | 3 | Bit 4–14 | Not used. |
| Deleted Flag | 1 | Bit 15 | Set if Segment is deleted. |

The function call nfsGetItem for retrieving selected information from a file will retrieve one of the following attributes: file creation time, data type, description, access password, read password, author ID, job number, priority level or the transcriber ID.

The function call nfsLength returns the length of the current file in bytes. If a file is not currently open, the call fails. The function call nfsOpen finds the specified file in the directory and opens it for both reading and writing. Since a file may consist of randomly sequenced segments of data and erasures, the function call must create a presentation map of the unerased data to be able to allow access to it as one continuous stream via call to nfsRead and nfsSeek.

The function call nfsRead reads data from the current file. The requested data is taken from the continuous stream using the presentation map created by nfsOpen.

The function call nfsRename renames the currently opened file. A new file header is created to record the new name, the old file header is marked as deleted, and optimization must be performed to update the file system's index of segments making the file accessible by the new name.

The function call nfsRmDir removes a subdirectory from the current directory. This also applies to directories in the root directory since every directory is a subdirectory of the root. The directory header is marked "deleted", but the space is not reclaimed until optimization. In addition, all files must be removed prior to the deletion of the directory.

The function call nfsSeek repositions the current file pointer. The current file pointer was created with the command Initialize, and represents the position in the sequential presentation of the data using the map created by nfsOpen and is without regard to the physical blocks referenced by the presentation map.

The function call nfsStat is used top obtain information from the current file. The retrievable statistics include total file size, the file's creation data, "last modified" time, and the edit time at the current position. The time is defined as the time since Jan. 1, 1970.

The function call nfsTell returns the sequential position in bytes of the current file. If a file is not currently open, the call fails.

The function call nfswrite writes data to the current file. Upon creation of a new segment, the current file position becomes the insertion point for the data. This is recorded when the segment is closed and used to update the presentation map created by nfsOpen. The initial call to nfswrite creates a data segment to be appended to the current file's list of data segments. Subsequent calls to nfswrite append data to this segment. The segment is completed and closed when any call is made to either nfsRead, nfsSeek or nfsClose. An important note that applies to a more generic memory implementation arises when a parameter used by nfswrite can specify whether the data will be inserted or overwrite a corresponding section of existing data. Obviously, overwriting previously saved data cannot occur with flash memory before erasure. Therefore, this overwrite option is implemented by inserting and then deleting corresponding old data.

The description of the API function calls provides the high level function calls of the file system. More specific to hardware, however, are the BIOS calls. BIOS calls are typically implemented in firmware or hardware, such as on an EEPROM integrated circuit which typically comes with a processor board in a personal computer. BIOS calls are lower level function calls because they are written specifically for particular hardware. Changing the hardware, such as the memory media, would require an update to BIOS. Table 13 below lists the BIOS calls implemented in a preferred embodiment of the present invention.

TABLE 13

| Function | Description |
| --- | --- |
| ClipConfig | Returns the configuration of the user data media. |
| CopyDataToData | Moves data from one location to another |
| EraseBlock | Erases on user data block (Flash block) |
| GetDataByte | Retrieves one byte of user data from the current location |
| GetTime | Retrieve the current date & time in DOS format. |

TABLE 13-continued

| Function | Description |
| --- | --- |
| GetWorkByte | Retrieves on byte of work area data from the current location. |
| PutDataByte | Writes one byte to the current user data location. |
| PutWorkByte | Writes one byte to the current work area location. |
| SetDataAddress | Repositions the user data area pointer. |
| SetWorkAddress | Repositions the work area pointer. |

The first BIOS call is ClipConfig which queries the storage media and returns configuration parameters. This command informs the file system if any particular API function calls will not function.

The BIOS call CopyDataToData is useful for making bulk memory block copies from one location to another. This command is particularly useful when using flash memory because it allows the file system to quickly create large blocks of contiguous memory. This is particularly important because the file system is only capable of writing data to contiguous memory.

Of substantial importance to the present invention is the BIOS call EraseBlock which erases entire blocks of memory rapidly so that contiguous memory space can be freed for writing long data files.

The BIOS calls of GetDataByte, GetWorkByte, PutDataByte and PutWorkByte are important for low level manipulation of data at the byte level.

The BIOS call GetTime is defined as returning the time since Jan. 1, 1970. This call works in conjunction with nfsStat as previously explained.

Finally, SetDataAddress and SetWorkAddress change the current address to the user data area or user work area, respectively.

It is to be understood that the above-described embodiments are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method of memory management for a primary memory created from a non-volatile, long-term storage medium, said method enabling direct manipulation of contiguous and non-contiguous discrete data segments stored therein by a file system, and comprising the steps of:

(a) creating the primary memory from a non-volatile, long-term storage medium, wherein the primary memory comprises a plurality of blocks in which the data segments are to be stored;

(b) coupling a cache memory to the primary memory, said cache memory providing temporary and volatile storage for at least one of the data segments;

(c) writing a new data segment from the cache memory to the primary memory by linking said new data segment to a sequentially previous logical data segment by the following steps:

(1) receiving the new data segment in the cache memory;

(2) moving the new data segment from the cache memory to a next available space within primary memory such that the new data segment is stored in primary memory in non-used memory space;

(3) identifying the previous logical data segment in primary memory;

(4) creating a logical link between the previous logical data segment and the new data segment such that the logical link provides a path for sequentially accessing the data segments within the primary memory; and (5) creating additional serial and logical links as subsequent new data segments are written to primary memory, said logical links providing the path for serially accessing the data segments regardless of contiguity of the data segments relative to each other within the primary memory.

2. The method of claim 1 wherein the method comprises the additional step of reading at least one data segment from primary memory by following the steps of:

(a) moving backwards or forwards from a current data segment to other serially and logically linked data segments within the primary memory along a path of serial and logical links;

(b) identifying the at least one data segment when it is the current data segment; and (c) retrieving the current data segment from the primary memory by reading said data segment into the cache memory.

3. The method as defined in claim 2 wherein the method comprises the additional step of creating a current file pointer, said current file pointer being a physical address stored in a memory corresponding to a location of a file in the primary memory, and wherein the file system accesses files stored in the primary memory by retrieving data beginning at the physical address stored in the current file pointer.

4. The method as defined in claim 3 wherein the step of moving forwards to other serially and logically linked data segments from a current data segment comprises the additional steps of:

(a) locating a next data segment address pointer stored in the current data segment which stores an address of the next data segment which is logically linked to the current data segment;

(b) retrieving the address from the next data segment address pointer; and (c) storing the address in the current file pointer.

5. The method as defined in claim 4 wherein the step of moving backwards to other serially and logically linked data segments from a current data segment comprises the additional steps of creating a history of movement by the current file pointer along the linked data segments:

(a) creating a memory stack for storing address pointers in memory, said stack following a last in, first out process for pushing on and popping off address pointers from the stack;

(b) pushing an address pointer of a root directory onto the stack when the file system is initialized; and (c) sequentially pushing subsequent address pointers onto the stack from the current file pointer as the current file pointer moves down a logical link to a last data segment from which the file system needs to backtrack.

6. The method as defined in claim 5 wherein the step of moving backwards to other serially and logically linked data segments from a current data segment comprises the additional steps of:

(a) sequentially popping a top address pointer from the stack, said top address being an address pointer to a preceding data segment;

(b) storing the popped top address pointer to the current file pointer; and (c) repeating steps (a) and (b) until the current address pointer contains the address of a desired data segment.

7. The method as defined in claim 2 wherein the file system includes application program instructions which execute functions of the file system which are compatible with DOS compliant computer devices.

8. The method as defined in claim 7 wherein the file system includes BIOS function calls which are specific to memory type such that application program instructions are implemented in context of the memory technology.

9. The method as defined in claim 2 wherein the method of memory management includes the step of creating logical blocks which overlay a physical memory structure of primary memory, said logical blocks comprising at least one erase block.

10. The method as defined in claim 9 wherein the step of creating logical blocks which overlay the physical memory structure further includes the step of creating logical memory block maps within each logical block, said memory block map indicating whether the at least one erase block is nonfunctional.

11. The method as defined in claim 10 wherein the step of creating logical memory blocks maps includes the step of creating a logical block control map, said map including a physical address of the physical memory over which the logical block corresponds, an address of a next available memory equal size block in which data may be stored, and a nonfunctional block map.

12. The method as defined in claim 1 wherein the step of creating the primary memory from a non-volatile, long-term storage medium comprises the more specific step of selecting flash memory as the primary memory.

13. The method as defined in claim 12 wherein the step of creating the primary memory from flash memory comprises the more specific step of selecting NAND technology flash memory as primary memory.

14. The method as defined in claim 1 wherein the step of coupling the cache memory to the primary memory comprises the more specific step of coupling a random access memory to the primary memory.

15. The method as defined in claim 1, wherein the step of creating a logical link between the previous logical data segment and the new data segment comprises the steps of:
(a) appending a header to new data segments when writing the new data segments to primary memory by moving the new data segment from the cache memory to the next available contiguous memory space within primary memory; and
(b) including in the header at least one address pointer so as to logically link the header to other data segments.

16. The method as defined in claim 15 wherein the step of appending a header to the new data segments comprises the more specific step of selecting a header from the group consisting of a device, volume, directory, file, data, and tree header.

17. The method as defined in claim 11 wherein the step of appending a header to the new data segments comprises the more specific step of selecting a header-like data structure from the group consisting of a tree node, a segment index entry, and a secondary segment index entry.

18. The method as defined in claim 15 wherein the step of appending a header to the new data segments so as to create the logical link to the other data segments comprises the more specific steps of including within the header an identification field wherein unique identification data is stored such that no headers in the primary memory have the same identification data.

19. The method as described in claim 15 wherein the method of memory management for a primary memory comprises the additional step of reserving a fixed amount of primary memory for an edit history which provides a record of all modifications to at least one file stored in primary memory.

20. The method as described in claim 19 wherein the method of memory management which reserves the fixed amount of primary memory for an edit history comprises the more specific step of creating a playback tree structure, said playback tree structure providing temporary storage space in the work memory for a copy of sequentially related data segments comprising the at least one file stored in primary memory.

21. The method as defined in claim 20 wherein the step of creating a playback structure in temporary storage space comprises the steps of:
(a) creating a first tree header including a first tree node address pointer and a next tree node address pointer, said first tree header corresponding to a directory in which the current file pointer resides;
(b) creating at least one tree node including a next tree node address pointer, a branch node pointer, a data address pointer and a data size field, said at least one tree node corresponding to a file whose address is contained within the current file pointer.

22. The method as defined in claim 20 wherein the step of creating a playback structure in temporary storage space which provides seamless playback of data stored in a file of primary memory includes the ability to logically insert new data in an existing data segment by the steps of:
(a) creating a second tree node which enables retrieval of a portion of the existing data segment which is designated as pre-insertion data;
(b) creating a third tree node which enables retrieval of data from a new data header, said new data header containing the new data to be logically inserted, and said new data being seamlessly retrievable after retrieval of the pre-existing data; and
(c) creating a fourth tree node which enables seamless retrieval of a portion of the existing data segment which is designated as post-insertion data after retrieval of the new data.

23. The method as defined in claim 20 wherein the step of creating a playback structure in temporary storage space which provides seamless playback of data stored in a file stored in primary memory includes the ability to logically delete a portion of data from an existing data segment without physically deleting said portion, and comprising the steps of:
(a) creating a second tree node which enables retrieval of a portion of the existing data segment which is designated as pre-erasure data; and
(b) creating a third tree node which enables seamless retrieval of a portion of the existing data segment which is designated as post-erasure data after retrieval of the pre-erasure data.

24. The method as defined in claim 23 wherein the method comprises the additional step of creating a new data header which records location information about the portion of data being logically deleted from the existing data segment.

25. The method as defined in claim 20 wherein the method of memory management comprises the more specific steps of separating the work memory from a user memory in primary memory, said work memory being dedicated to storing the playback tree structures.

* * * * *